United States Patent
Chang (10) Patent No.: US 9,099,816 B2
(45) Date of Patent: Aug. 4, 2015

(54) CONNECTION DEVICE FOR DETECTING CONNECTION STATUS, ELECTRICAL CONNECTION ASSEMBLY, AND ELECTRONIC APPARATUS

(75) Inventor: Chin-Jung Chang, New Taipei (TW)

(73) Assignee: Getac Technology Corporation, Hsinchu (TW)

( * ) Notice: Subject to any disclaimer, the term of this patent is extended or adjusted under 35 U.S.C. 154(b) by 629 days.

(21) Appl. No.: 13/485,656

(22) Filed: May 31, 2012

(65) Prior Publication Data

US 2013/0162050 A1  Jun. 27, 2013

(30) Foreign Application Priority Data

Dec. 21, 2011  (CN) .......................... 2011 1 0431502

(51) Int. Cl.
- *H01R 29/00* (2006.01)
- *H01R 13/66* (2006.01)
- *H01R 27/00* (2006.01)
- *G01R 31/04* (2006.01)

(52) U.S. Cl.
CPC ............ *H01R 13/6683* (2013.01); *H01R 27/00* (2013.01); *H01R 29/00* (2013.01); *G01R 31/045* (2013.01); *Y10T 307/729* (2015.04)

(58) Field of Classification Search
CPC .... H01R 13/6681; H01R 27/00; H01R 29/00; G01R 31/045; Y10T 307/729
USPC .................................................... 307/86, 125
See application file for complete search history.

(56) References Cited

U.S. PATENT DOCUMENTS

2006/0238942 A1   10/2006   Chang et al.

FOREIGN PATENT DOCUMENTS

| CN | 201130767 Y | 10/2008 |
|---|---|---|
| CN | 201812968 U | 4/2011 |
| TW | M401887 | 4/2011 |
| TW | M406842 | 7/2011 |

OTHER PUBLICATIONS

German Office Action in Application No. 10 2002 105 556.4, dated Dec. 19, 2014.

*Primary Examiner* — Hal Kaplan (57) ABSTRACT

A connection device for detecting connection status is used for detecting that an electrical connector is inserted in upside up position or upside down position. In the connection device, first connecting terminals are disposed on a first side while second connecting terminals are disposed on a second side. When the electrical connector is connected to the connection device, the terminals, which do not establish connection with the electrical connector, contact with a metal housing of the electrical connector. Therefore, at least two of these terminals are short circuited. Through determining which group of the first connecting terminals and the second connecting terminals is short circuited, a control module determines that the electrical connector is inserted in upside up position or upside down position.

19 Claims, 8 Drawing Sheets

CONNECTION DEVICE FOR DETECTING CONNECTION STATUS, ELECTRICAL CONNECTION ASSEMBLY, AND ELECTRONIC APPARATUS

BACKGROUND

1. Technical Field

This disclosure relates to electrical connection, and more particularly to a connection device for detecting connection status, an electrical connection assembly, and an electronic apparatus.

2. Related Art

Figure 1:
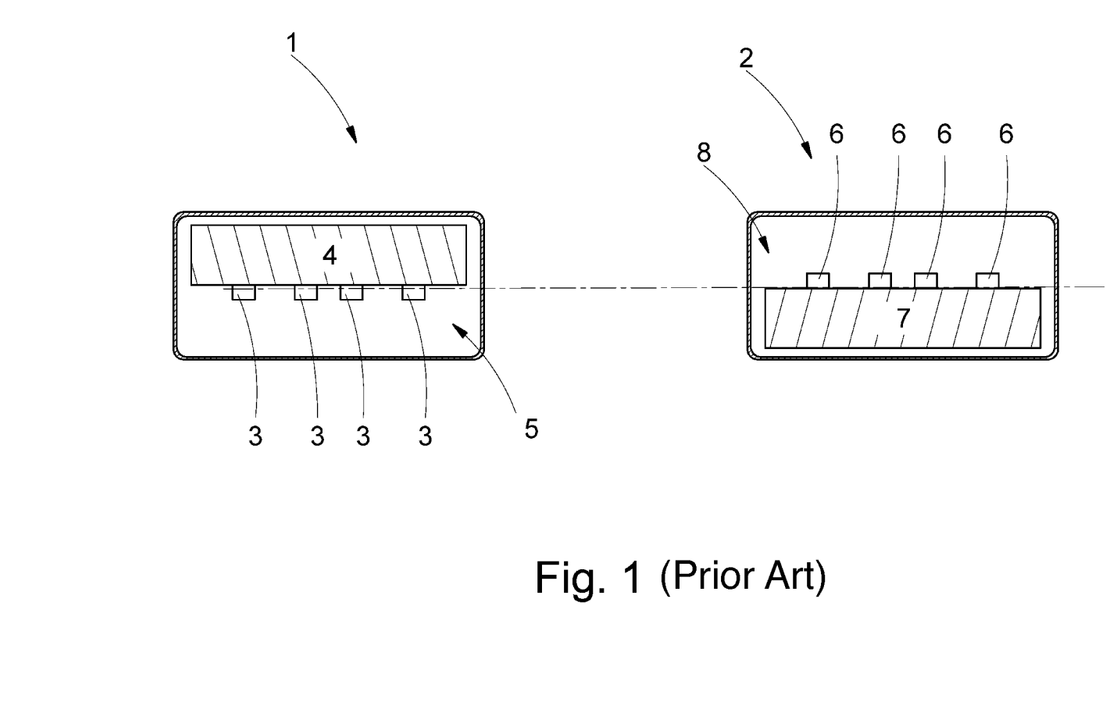
FIG. 1 is a front view of a connection device and an electrical connector in the art.

Please refer to FIG. 1, in which an electrical connection device 1 and an electrical connector 2 configured with foolproof mechanism are shown. Through asymmetric structure, the electrical connector 2 is required to be inserted into the connection device 1 in upside up position, thereby preventing the user from inserting the electrical connector in upside down that causes damage to the connection device 1 and the electronic apparatus equipped with the connection device 1.

FIG. 1 shows the configuration of a USB connection device in the art; in which the terminals 3 are disposed on one side surface of the insulation seat 4, and the position of the insulation seat 4 is designed to be near one edge of the inserting hole 5. Similarly, in the electrical connector 2 the contact terminals 6 are disposed on one side surface of the other insulation seat 7, and the position of the insulation seat 7 is designed to be near one edge of the opening 8. Therefore, the electrical connector 2 has to be inserted into the connection device 1 in upside up position.

Taiwan (R. O. C.) Utility Model No. M401887 discloses a structure improvement for the electrical connector. M401887 proposes two identical sets of terminals, and the two sets are respectively disposed to two side surfaces of the insulation seat of the electrical connector. Meanwhile, the inserting hole is enlarged in M401887, and the insulation seat of the connection device is located at the center of the inserting hole, thereby the electrical connector can be inserted into the connection device either in upside up position or in upside down position and establish signal connection. M401887 does not teach how to determine that the electrical connector is inserted in upside up position or upside down position.

Taiwan (R. O. C.) Patent Application Publication TW201116975A1 proposes pin arrangement design of a connection device, which can be used to determine that the electrical connector is inserted in upside up position or upside down position and then change function of each pin of the connection device. The pin arrangement design of TW201116875A1 is applicable to connection device equipped two columns of pins, and function of each pin is also limited by the arrangement design. As a result, the pin arrangement design can not be applicable to connection device following the other Bus Interface protocol.

SUMMARY

Accordingly, at least one embodiment of this disclosure discloses a connection device for detecting connection status of an electrical connector to switch a transceiving mode thereof and perform signal transceiving. The electrical connector includes a metal housing configured with an opening, a first insulation seat configured with a mounting surface and disposed corresponding to the opening, and a plurality contact terminals disposed on the mounting surface.

The connection device includes a second insulation seat, at least one first signal terminal, a first power terminal, a first grounding terminal, at least one second signal terminal, a second power terminal, a second grounding terminal, and a control module.

The second insulation seat includes a first side surface and a second side surface. The second insulation seat is provided for inserting into the opening with the first side surface and the second side surface respectively facing the mounting surface and an inner surface of the metal housing.

The first signal terminal, the first power terminal, and the first grounding terminal are respectively disposed on the first side surface and corresponding to the contact terminals.

The second signal terminal, the second power terminal, and the second grounding terminal are respectively disposed on the second side surface and corresponding to the contact terminals.

The control module is provided for detecting whether the first power terminal and the first grounding terminal are electrically connected to each other through the metal housing, and detecting whether the second power terminal and second grounding terminal are electrically connected to each other through the metal housing, so as to obtain the connection status of the electrical connector.

At least one embodiment of this disclosure discloses an electrical connection assembly, which includes a case, an insulation seat, a first connecting terminals, a first power terminal, a grounding terminal, a second connecting terminals, a second power terminal, a second grounding terminal, a first power chip, and a second power chip.

The case includes an inserting hole. The insulation seat is disposed in the inserting hole, and the insulation hole includes a first side surface and a second side surface. The first signal terminal, the first power terminal, and the first grounding terminal are respectively disposed on the first side surface, and the second signal terminal, the second power terminal, and the second grounding terminal are disposed on the second side surface.

The first power chip is provided for receiving electrical power from a power source and transmitting the electrical power to the first power terminal, and cutting off the electrical power transmission to the first power terminal when the first power terminal and the first grounding terminal are electrically connected to each other. The second power chip is provided for receiving the electrical power from the power source and transmitting the electrical power to the second power terminal, and cutting off the electrical power transmission to the second power terminal when the second power terminal and the second grounding terminal are electrically connected to each other. When the electrical connector is connected to the electronic apparatus, the unnecessary electrical power transmission is cut off to reduce power consumption.

At least one embodiment of this disclosure discloses an electrical electronic apparatus for an electrical connector to be connected to, and detecting connection status of the electrical connector. The electronic apparatus includes a system electronic circuit and an electrical connection assembly. The electrical connection assembly is provided for connecting the electrical connector to the system electronic circuit, and the control module of the electrical connection assembly detects whether the first power terminal and the first grounding terminal are electrically connected to each other, and whether the second power terminal and second grounding terminal are electrically connected to each other; so as to obtain the connection status of the electrical connector and switch the operation mode of the system electronic circuit according to the connection status of the electrical connector.

According to this disclosure, the electrical connector can follow the Bus Interface protocol standard either inserted in upside up position or in upside down position, and then establishes signal connection with the connection device. The electrical power transmission is cut off to the terminals if the terminals do not establish connection with the connection device, so as to reduce power consumption.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 2:
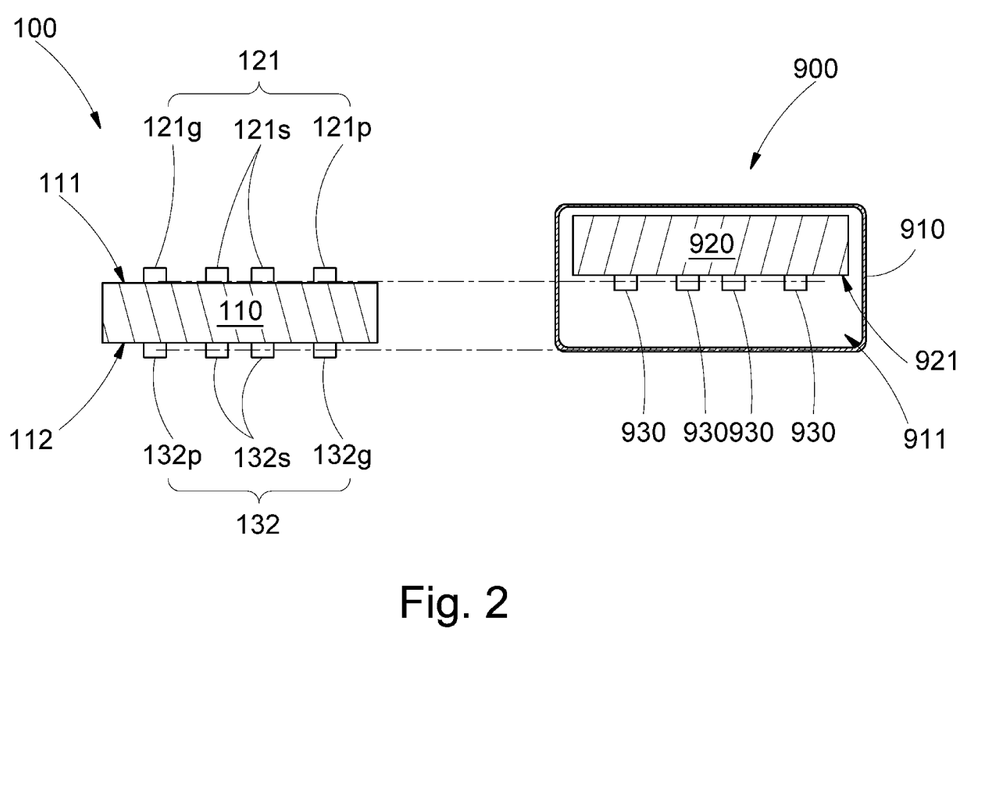
FIG. 2 is a front view of an electrical connector inserted into a connection device in upside up according to a first embodiment.
Figure 3:
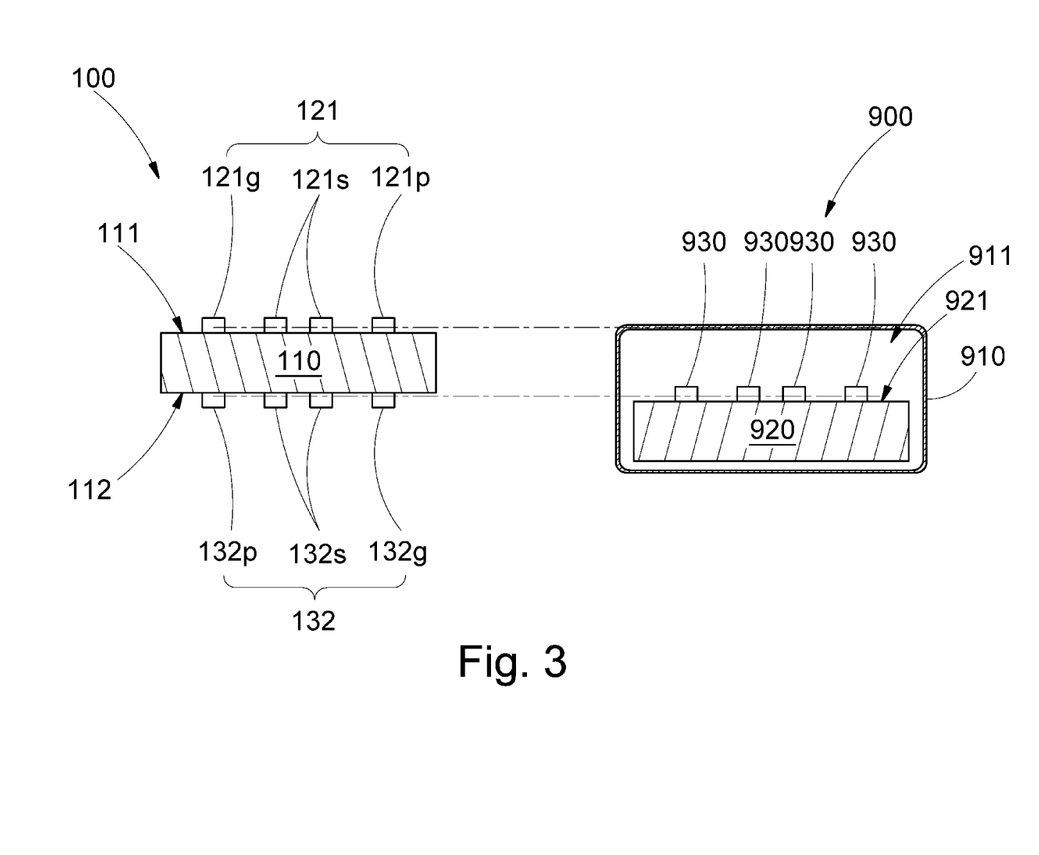
FIG. 3 is a front view of the electrical connector inserted into the connection device in upside down according to the first embodiment.

Please refer to FIG. 2 and FIG. 3, in which a connection device 100 for detecting connection status according to a first embodiment is illustrated, which is used to for detect that an electrical connector 900 is inserted in upside up position or upside down position, to switch a transceiving mode of the connection device 100 and perform signal transceiving.

As shown in FIG. 2 and FIG. 3, the electrical connector 900 includes a metal housing 910, a first insulation seat 920, and a plurality of contact terminals 930. The metal housing 910 is configured with an opening 911. The first insulation seat 920 is disposed in the metal housing 910 and corresponding to the opening 911. And the first insulation seat 920 is configured with a mounting surface 921. The contact terminals 930 are disposed on the mounting surface 921.

Figure 4:
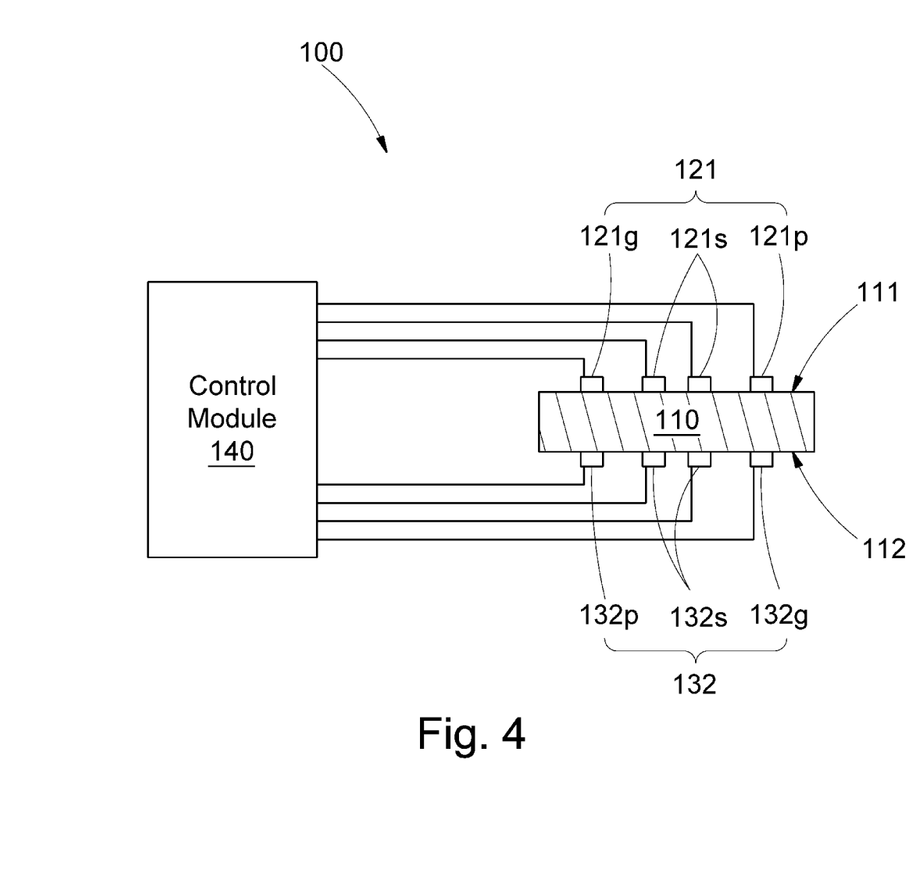
FIG. 4 is a block diagram of the connection device according to the first embodiment.

As shown in FIG. 2, FIG. 3, and FIG. 4, the connection device 100 includes a second insulation seat 110, a plurality of first connecting terminals 121, a plurality of second connecting terminals 132, and a control module 140.

The second insulation seat 110 includes a first side surface 111 and a second side surface 112. When the electrical connector 900 is connected to the connection device 100, the second insulation seat 110 is inserted into the opening 900 of the metal housing 910. Meanwhile, the first side surface 111 and the second side surface 112 of the second insulation seat 110 respectively face the mounting surface 921 and an inner surface of the metal housing 910.

The first connecting terminals 121 are respectively disposed on the first side surface 111 of the second insulation seat 110 for contacting with the contact terminals 930, so as to establish signal connection with the electrical connector 900.

The second connecting terminals 132 are respectively disposed on the second side surface 112 of the second insulation seat 110 for contacting with the contact terminals 930, so as to establish signal connection with the electrical connector 900.

As shown in FIG. 2 and FIG. 3, the first connecting terminals 121 and the second connecting terminals 132 do not establish signal connection with the electrical connector 900 simultaneously.

As shown in FIG. 4, the first connecting terminals 121 and the second connecting terminals 132 are electrically connected to the control module 140. The control module 140 is used to detect whether at least two of the first connecting terminals 121 are short circuited, and detect whether at least two of the second connecting terminals 132 are short circuited.

As shown in FIG. 2 and FIG. 4, when the electrical connector 900 is inserted into the connection device 100 in the upside up position, each first connecting terminal 121 contacts one or more corresponding contact terminals 930, and then the first connecting terminals 121 establish signal connection with the electrical connector 900. Meanwhile, the second connecting terminals 132 contact the metal housing 910 and are short circuited. When the control module 140 detects that at least two of the second connecting terminals 132 are short circuited, the control module 140 determines that the first connecting terminals 121 establish signal connection with the electrical connector 900, and the electrical connector 900 is inserted into the connection device 100 in upside up position.

As shown in FIG. 3 and FIG. 4, when the electrical connector 900 is inserted into the connection device in the upside down position, each second connecting terminal 132 contacts one or more corresponding contact terminals 930, and then the second connecting terminals 132 establish signal connection with the electrical connector 900. Meanwhile, the first connecting terminals 121 contact the metal housing 910 and are short circuited. When the control module 140 detects that at least two of the first terminals 121 are short circuited, the control module 140 determines that the second connecting terminals 132 establish signal connection with the electrical connector 900, and the electrical connector 900 is inserted into the connection device in the upside down position.

In order to reduce unnecessary power consumption of the connection device 100, the control module 140 cuts off electrical power transmission to the second connecting terminals 132 when the first connecting terminals 121 establish signal connection with the electrical connector 900 (the electrical connector 900 is inserted into the connection device 100 in the upside up position). When the second connecting terminals 132 establish signal connection with the electrical connector 900 (the electrical connector 900 is inserted into the connection device 100 in the upside down position), the control module 140 cuts off electrical power transmission to the first connecting terminals 121.

Furthermore, the control module 140 issues a message for prompting that the first connecting terminals 121 or the second connecting terminals 132 establish signal connection with the electrical connector 900, such that the user is prompted that the electrical connector 900 is inserted in the upside up position or in the upside down position.

As shown in FIG. 2, FIG. 3, and FIG. 4, the first connecting terminals 121 includes one or more first signal terminals 121s, a first power terminals 121p, and a first grounding terminal 121g respectively disposed on the first side surface 111 of the second insulation seat 110. The second connecting terminals 132 includes one or more second signal terminals 132s, a second power terminal 132p, and a second grounding terminal 132g respectively disposed on the second side surface 112 of the second insulation seat 110.

The configuration of the relative positions of the first signal terminals 121s, the first power terminal 121p, and the first grounding terminal 121g is arranged corresponding to the configuration of the relative positions of the contact terminals 930, and follows a designated Bus Interface protocol standard. Therefore, the first signal terminals 121s, the first power terminal 121p, and the first grounding terminal 121g are used to respectively contact one or more corresponding contact terminals 930 and establish signal connection.

Likewise, the configuration of the relative positions of the second signal terminals 132s, the second power terminal 132p, and the second grounding terminal 132g is arranged corresponding to the configuration of the relative positions of the contact terminals 930, and follows the designated Bus Interface protocol standard. Therefore, the second signal terminals 132s, the second power terminal 132p, and the second grounding terminal 132g are used to respectively contact one or more corresponding contact terminals 930 and establish signal connection.

As shown in FIG. 4, in a specific example, the control module 140 is used for detecting whether the first power terminal 121p and the first grounding terminal 121g are electrically connected to each other through the metal housing 910, and detecting whether the second power terminal 132p and the second grounding terminal 132g are electrically connected to each other through the metal housing 910, so as to obtain the connection status of the electrical connector 900.

Figure 5:
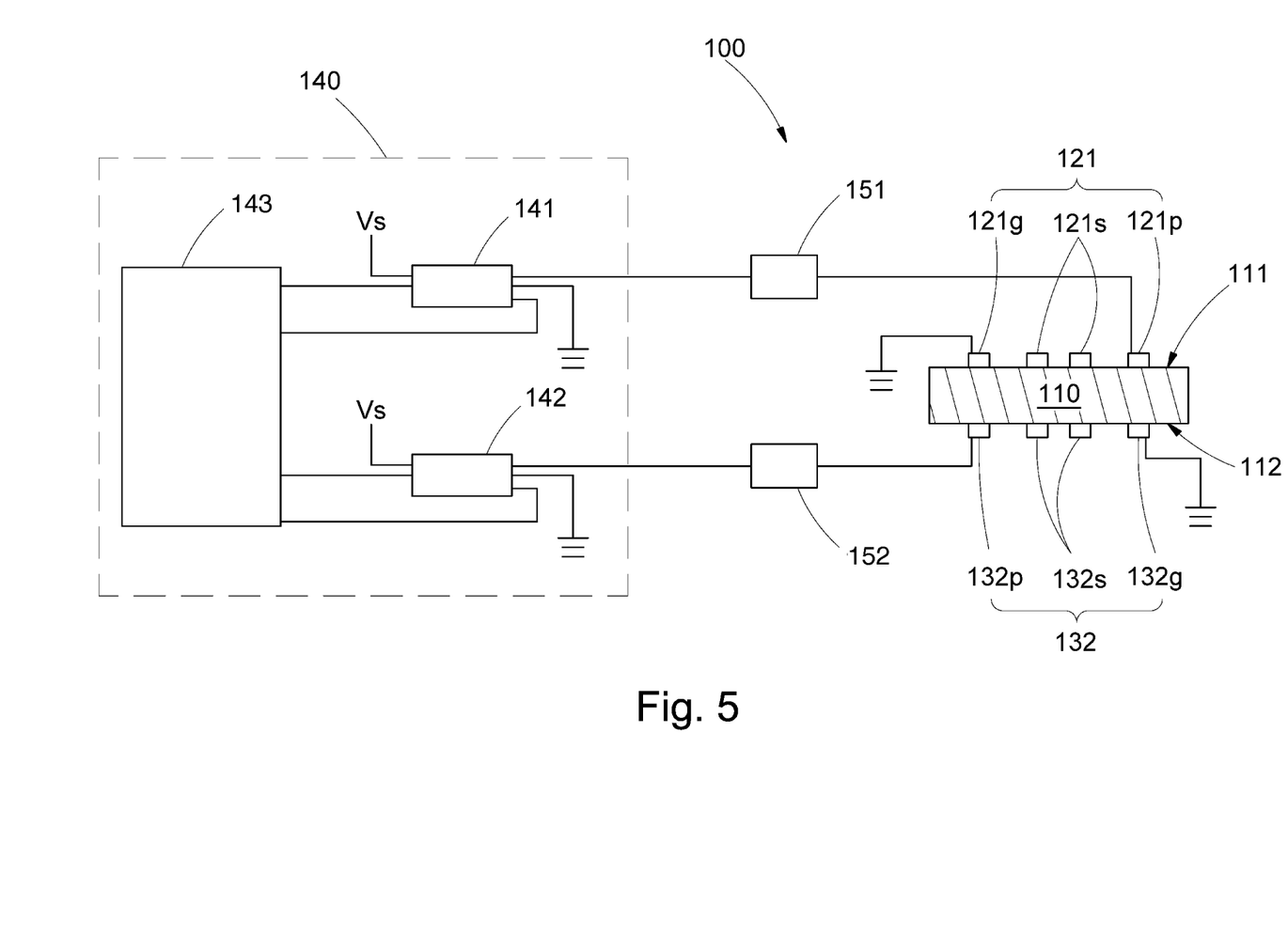
FIG. 5 is a block diagram of the connection device according to the first embodiment.

As shown in FIG. 5, in a specific example, the control module 140 includes a first power chip 141, a second power chip 142, and a controller 143.

The first power chip 141 receives electrical power from a power source Vs and transmitting the electrical power to the first power terminal 121p. The first power chip 141 also detects the electrical connection status among the first power terminal 121p and the first grounding terminal 121g. When the first power terminal 121p and the first grounding terminal 121g are electrically connected to each other through the metal housing 910, the current transmitted from the first power chip 141 to the first power terminal 121p will be overloaded, and the first power chip 141 will cut off the electrical power transmission to the first power terminal 121p.

The second power chip 142 receives the electrical power from the power source Vs and transmitting the electrical power to the second power terminal 132p. The second power chip 142 also detects electrical connection status among the second power terminal 132p and the second grounding terminal 132g. When the second power terminal 132p and the second grounding terminal 132g are electrically connected to each other through the metal housing 910, the current transmitted from the second power chip 142 to the second power terminal 132p will be overloaded, and the second power chip 142 will cut off the power supply to the second power terminal 132p.

The controller is electrically connected to the first power chip 141 and the second power chip 142, for detecting the electrical power transmission of the first power chip 141 and the second power chip 142. According to the electrical power transmission of the first power chip 141 and the second power chip 142, the controller 143 determines the connection status of the electrical connector 900, so as to further determine which group of the first connecting terminals 121 and the second connecting terminals 132 is performing signal transceiving. The controller 143 also issues a message to prompt that the first connecting terminals 121 or the second connecting terminals establish signal connection with the electrical connector 900, such that the user is prompted that the electrical connector 900 is inserted in the upside up position or in the upside down position.

In specific embodiment, the controller 143 is a keyboard controller (KBC) or an embedded controller (EC). Through additional programmable instructions in the EC/KBC BIOS, the controller 143 detects the electrical power transmission of the first power chip 141 and the second power chip 142 and determines the connection status of the electrical connector 900.

As shown in FIG. 5, the surge occurs when the first power chip 141 and the second power chip 142 switches the electrical power transmission ON/OFF or the power source output electrical power unstably. The connection device 100 further includes a first filtering circuit151 and a second filtering circuit 152. The first filtering circuit 151 or the second filtering circuit 152 includes resistant components connected in serial or in parallel. These resistance components include resistors and capacitors. The first filtering circuit 151 is configured between the first power terminal 121p and the first power chip 141; the second filtering circuit 152 is configured between the second power terminal 132p and the second power chip 142. The first filtering circuit 151 and the second filtering circuit 152 are used to filter the surge and prevent the surge from transmitting to the first power terminal 121p and the second power terminal 132p.

Figure 6:
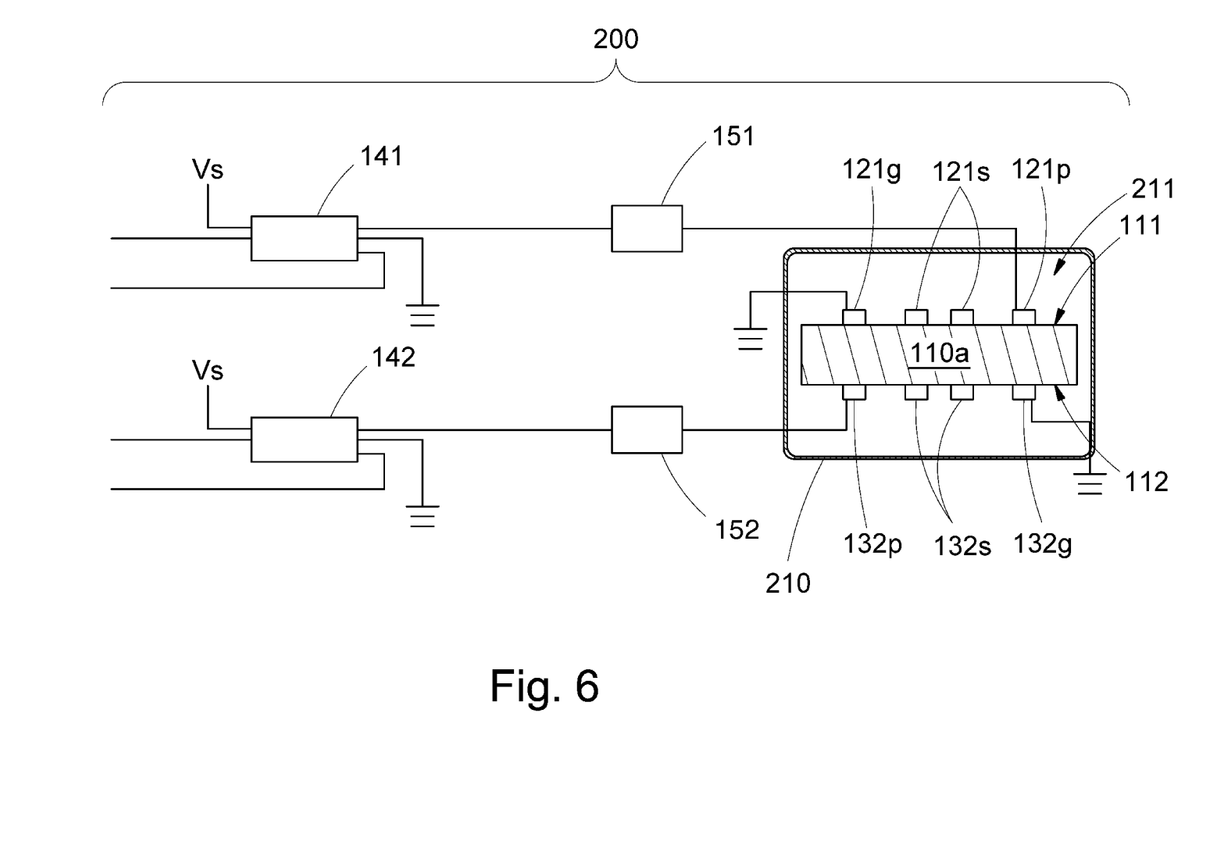
FIG. 6 is a block diagram of an electrical connection assembly according to a second embodiment.
Figure 7:
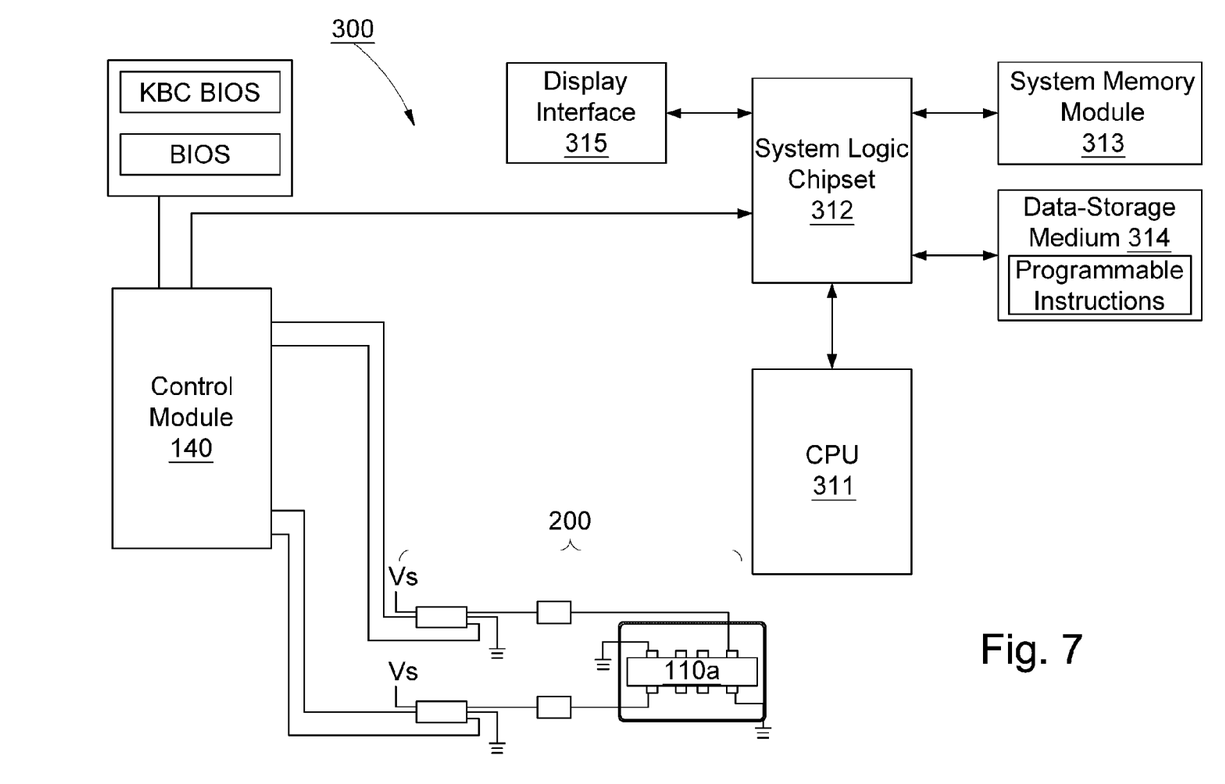
FIG. 7 is a block diagram of an electronic apparatus according to a third embodiment.

As shown in FIG. 6 and FIG. 7, in which an electrical connection assembly 200 according to a second embodiment is illustrated. The electrical connection assembly 200 includes a case 210, an insulation seat 110a, one or more first signal terminal 121s, a first power terminal 121p, a first grounding terminal 121g, one or more second signal terminal 132s, a second power terminal 132p, and a second grounding terminal 132g.

The case 210 includes an inserting hole 211. The insulation seat 110a is substantially identical to the second insulation seat 110 in the first embodiment. The insulation seat 110a is disposed in the inserting hole 211 and the insulation seat 110a includes a first side surface 111 and a second side surface 112. The insulation seat 110a is located at the center of the inserting hole 211. Either the electrical connector 900 is inserted in upside up position or upside down position, the metal housing 910 can insert into inserting hole 211, so as to insert the insulation seat 110a into the opening 911 of the metal housing 910.

The first signal terminal 121s, the first power terminal 121p, and the first grounding terminal 121g are identical to those disclosed in the first embodiment and are respectively disposed on the first side surface 111. The second signal terminal 132s, the second power terminal 132p, and the second grounding terminal 132g are identical to those disclosed in the first embodiment and are disposed on the second side surface 112.

The electrical connection assembly 200 further includes a first power chip 141 and a second power chip 142. The first power chip 141 is used to receive the electrical power from the power source Vs, and transmits the electrical power to the first power terminal 121p. The first power chip 141 cuts off the electrical power transmission when the first power terminal 121p and the first grounding terminal 121g are electrically connected to each other. The second power chip 142 is used to receive the electrical power from the power source Vs, and transmits the electrical power to the second power terminal 132p. The second power chip 142 cuts off the electrical power transmission when the second power terminal 132p and the second grounding terminal 132g are electrically connected to each other.

In the second embodiment, except the case 210, elements and connections are substantially identical to those in the connection device 100 in the first embodiment. Similarly, the electrical connection assembly 200 in the second embodiment includes a first filtering circuit 151 and a second filtering circuit 152. The first filtering circuit 151 is configured between the first power terminal 121p and the first power chip 141. The second filtering circuit 152 is configured between the second power terminal 132p and the second power chip 142.

In the first embodiment and the second embodiment, the configuration of the relative positions of the first signal terminal 121s, the first power terminal 121p, and the first grounding terminal 121g follows the USB standard. Similarly, the configuration of the relative positions of the second signal terminal 132s, the second power terminal 132p, and the second grounding terminal 132g follows the USB standard. The USB standard includes USB 3.0, USB 2.0, USB 1.1, and USB 1.0.

Please refer to FIG. 7, in which an electronic apparatus 300 according to as third embodiment is illustrated. The electronic apparatus 300 is provided for an electrical connector 900 to be connected to and detects the connection status of the electrical connector 900. The electronic apparatus 300 includes a system electronic circuit and the electrical connection assembly 200 as disclosed in the second embodiment.

The system electronic circuit us used to provide a predetermined function and to switch the operation mode of the electronic apparatus 100 according to the connection status of the electrical connector 900. The system electronic circuit at least includes a central processing unit (CPU) 311, a system logic chipset 312, a system memory module 313, data-storage medium 314, and a display interface 315. The CPU 311, the system memory module 313, the data-storage medium 314, and the display interface 315 are electrically connected to the system logic chipset 312.

The electrical connection assembly 200 is used to connect the electrical connector 900 to the system logic chipset 312 of the system electronic circuit. In a specific example, the controller 143 is a KBC or an EC of the system electronic circuit, and the KBC or the EC is electrically connected to the CPU 311 through the system logic chipset 312. Through additional programmable instructions in the KBC/EC BIOS, the KBC or the EC detects that the electrical connector 900 is inserted in upside up position or upside down position.

As shown in FIG. 6 and FIG. 7, the CPU 311 loads and executes a programmable instruction form the data-storage medium 314. When the second power terminal 132p and the second grounding terminal 132g are electrically connected to each other, the controller 143 determines that the electrical connector 900 is inserted in the upside up position. At this time, the controller 143 issues a message to prompt that the electrical connector 900 is inserted in the upside up position. The message is transmitted to the CPU 311 via the system logic chipset 312, and the CPU 311 transmits a control command to the display interface 315. As a result, through the display interface 315 displaying text or image, the system electronic circuit prompts that the first power terminal 121p and first grounding terminal 121g are electrically connected to the contact terminal 930s and the electrical connector 900 is inserted in the upside up position.

When the first power terminal 121p and the first grounding terminal 121g are electrically connected to each other, the controller 143 determines that the electrical connector 900 is inserted in the upside down position. At this time, the controller 143 issues a message to prompt that the electrical connector 900 is inserted in the upside down position. The message is transmitted to the CPU 311 via the system logic chipset 312, and the CPU 311 issues a control command to the display interface 315. As a result, the system electronic circuit outputs text or image through the display interface 315 to prompt that the second signal terminal 132s, the second power terminal 132p, and the second grounding terminal 132g are electrically connected to the contact terminal 930 and the electrical connector 900 is inserted in the upside down position.

Figure 8:
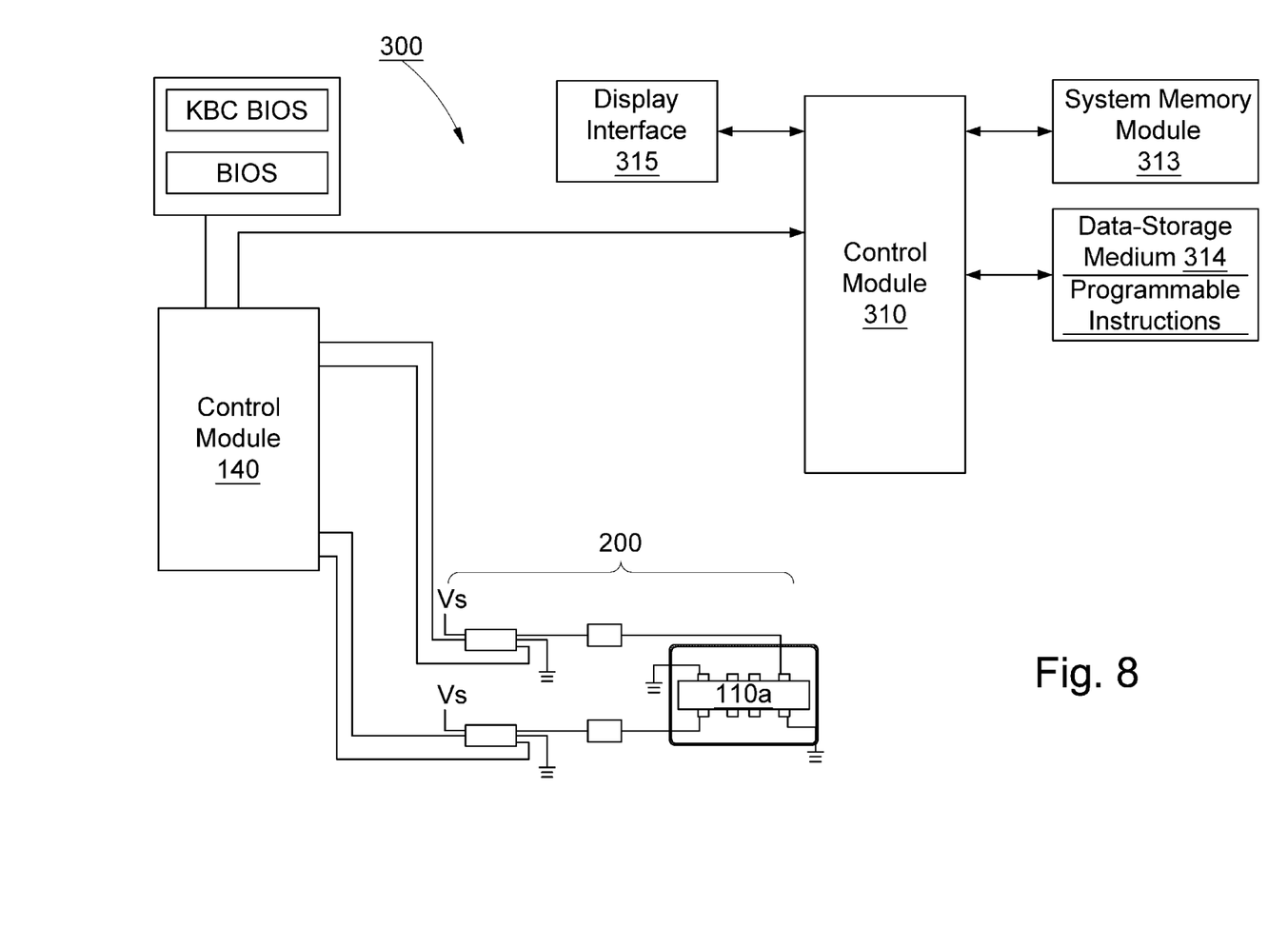
FIG. 8 is a block diagram of an electronic apparatus according to a fourth embodiment.

As shown in FIG. 8, in which an electronic apparatus 300 according to a fourth embodiment is illustrated. The electronic apparatus 300 is provided for an electrical connector 900 to be connected to and detects the connection status of the electrical connector 900. The electronic apparatus 300 includes a system electronic circuit, and the electrical connection assembly 200 as disclosed in the second embodiment.

According to the fourth embodiment, the CPU and the system logic chipset are integrated into one single control module 310, such as a System-on-Chip (SoC). And the system memory module 313, the data-storage medium 314, and the display interface 315 are electrically connected to the control module 310. The controller 143 is also electrically connected to the control module 310. Other technical features are substantial identical to those in the third embodiment, the description related to is omitted hereinafter.

What is claimed is:

1. A connection device for detecting connection status of an electrical connector to switch a transceiving mode of the connection device and perform signal transceiving, wherein the electrical connector comprises a metal housing configured with an opening, a first insulation seat configured with a mounting surface and disposed corresponding to the opening, and a plurality of contact terminals disposed on the mounting surface, the connection device comprising:
   a second insulation seat, including a first side surface and a second side surface, wherein the second insulation seat is provided for inserting into the opening with the first side surface and the second side surface respectively facing the mounting surface and an inner surface of the metal housing;
   at least one first signal terminal, a first power terminal, and a first grounding terminal respectively disposed on the first side surface and for contacting with the contact terminals;
   at least one second signal terminal, a second power terminal, and a second grounding terminal respectively disposed on the second side surface and for contacting with the contact terminals; and
   a control module, for detecting whether the first power terminal and the first grounding terminal are electrically connected to each other through the metal housing, and detecting whether the second power terminal and second grounding terminal are electrically connected to each other through the metal housing, so as to obtain the connection status of the electrical connector.

2. The connection device as claimed in claim 1, wherein the control module comprises:
   a first power chip, for receiving electrical power from a power source and transmitting the electrical power to the first power terminal, and cutting off the electrical power transmission to the first power terminal when the first power terminal and the first grounding terminal are electrically connected to each other through the metal housing; and
   a second power chip, for receiving the electrical power from the power source and transmitting the electrical power to the second power terminal, and cutting off the electrical power transmission to the second power terminal when the second power terminal and the second grounding terminal are electrically connected to each other through the metal housing.

3. The connection device as claimed in claim 2, wherein the control module comprises a controller, electrically connected to the first power chip and the second power chip, and the controller determines the connection status of the electrical connector according to the electrical power transmission to the first power chip and the second power chip.

4. The connection device as claimed in claim 3, wherein the controller is a keyboard controller or an embedded controller.

5. The connection device as claimed in claim 2, further comprising:
   a first filtering circuit, configured between the first power terminal and the first power chip; and
   a second filtering circuit, configured between the second power terminal and the second power chip.

6. An electrical connection assembly, comprising:
   a case, including an inserting hole;
   an insulation seat, disposed in the inserting hole, and including a first side surface and a second side surface;
   a plurality of first signal terminals, a first power terminal, and a first grounding terminal respectively disposed on the first side surface;
   a plurality of second signal terminals, a second power terminal, and a second grounding terminal respectively disposed on the second side surface;
   a first power chip, for receiving electrical power from a power source and transmitting the electrical power to the first power terminal, and cutting off the electrical power transmission to the first power terminal when the first power terminal and the first grounding terminal are electrically connected to each other; and
   a second power chip, for receiving the electrical power from the power source and transmitting the electrical power to the second power terminal, and cutting off the electrical power transmission to the second power terminal when the second power terminal and the second grounding terminal are electrically connected to each other.

7. The electrical connection assembly as claimed in claim 6, further comprising:
   a first filtering circuit, configured between the first power terminal and the first power chip; and
   a second filtering circuit, configured between the second power terminal and the second power chip.

8. The electrical connection assembly as claimed in claim 6, wherein:
   the configuration of the relative positions of the first signal terminals, the first power terminal, and the first grounding terminal follows the configuration required by Universal Standard Bus standard; and
   the configuration of the relative positions of the second signal terminals, the second power terminal, and the second grounding terminal follows the configuration required by Universal Standard Bus standard.

9. The electrical connection assembly as claimed in claim 6, wherein the Universal Standard Bus standard includes USB 3.0, USB 2.0, USB 1.1 and USB 1.0.

10. An electronic apparatus, for an electrical connector to be connected to and detecting connection status of the electrical connector, the electronic apparatus comprising:
    a system electronic circuit, for performing a pre-determined function and switching the operation mode of the electronic apparatus according to the connection status of the electrical connector; and
    an electrical connection assembly for connecting the electrical connector to the system electronic circuit, comprising:
    an insulation seat, including a first side surface and a second side surface;
    at least one first signal terminal, a first power terminal, and a first grounding terminal respectively disposed on the first side surface and for contacting with contact terminals of the connector;
    at least one second signal terminal, a second power terminal, and a second grounding terminal respectively disposed on the second side surface and for contacting with the contact terminals; and
    a control module, for detecting whether the first power terminal and the first grounding terminal are electrically connected to each other, and detecting whether the second power terminal and second grounding terminal are electrically connected to each other, so as to obtain the connection status of the electrical connector.

11. The electronic apparatus as claimed in claim 10, wherein the control module comprises:
    a first power chip, for receiving electrical power from a power source and transmitting the electrical power to the first power terminal, and cutting off the electrical power transmission to the first power terminal when the first power terminal and the first grounding terminal are electrically connected to each other; and
    a second power chip, for receiving the electrical power from the power source and transmitting the electrical power to the second power terminal, and cutting off the electrical power transmission the second power terminal when the second power terminal and the second grounding terminal are electrically connected to each other.

12. The electronic apparatus as claimed in claim 10, wherein the control module comprises a controller, electrically connected to the first power chip and the second power chip, and the controller determines the connection status of the electrical connector according to the electrical power transmission to the first power chip and the second power chip.

13. The electronic apparatus as claimed in claim 10, further comprising:
    a first filtering circuit, configured between the first power terminal and the first power chip; and
    a second filtering circuit, configured between the second power terminal and the second power chip.

14. The electronic apparatus as claimed in claim 10, wherein the system electronic circuit comprises at least a central processing unit, a system logic chipset, a system memory module, a data-storage medium, and a display interface, and the central processing unit, the system memory module, the data-storage medium, and the display interface are electrically connected to the system logic chipset.

15. The electronic apparatus as claimed in claim 14, wherein:
    when the second power terminal and the second grounding terminal are electrically connected to each other, through the display interface the system electronic circuit prompts that the first signal terminals, the first power terminal, and the first grounding terminal are electrically connected to the contact terminals; and
    when the first power terminal and the first grounding terminal are electrically connected to each other, through the display interface the system electronic circuit prompts that the second signal terminals, the second power terminal, and the second grounding terminal are electrically connected to the contact terminals.

16. The electronic apparatus as claimed in claim 10, wherein
the configuration of the relative positions of the first signal terminals, the first power terminal, and the first grounding terminal follows the configuration required by Universal Standard Bus standard; and
the configuration of the relative positions of the second signal terminals, the second power terminal, and the second grounding terminal follows the configuration required by Universal Standard Bus standard.

17. A connection device for detecting that an electrical connector is inserted in upside up position or upside down position, the connection device comprising:
first connecting terminals disposed on a first side surface, for establishing signal connection with the electrical connector;
second connecting terminals disposed on a second side surface, for establishing signal connection with the electrical connector; wherein the first connecting terminals and the second connecting terminals do not establish signal connection with the electrical connector simultaneously; and
a control module, for detecting whether at least two of the first connecting terminals are short circuited, and detecting whether at least two of the second connecting terminals are short circuited;
wherein when the control module detects that at least two of the second connecting terminals are short circuited, the control module determines that the first connecting terminals establish signal connection with the electrical connector; when the control module detects that at least two of the first terminals are short circuited, the control module determines that the second connecting terminals establish connection with the electrical connector.

18. The connection device as claimed in claim 17, wherein when the first connecting terminals establish signal connection with the electrical connector, the control module cuts off electrical power transmission to the second connecting terminals; when the second connecting terminals establish signal connection with the electrical connector, the control module cuts off the electrical power transmission to the first connecting terminals.

19. The connection device as claimed in claim 17, wherein the control module further issues a message for prompting that the first connecting terminals or the second connecting terminals establish signal connection with the electrical connector.

* * * * *